United States Patent
de Jager

(10) Patent No.: US 7,016,014 B2
(45) Date of Patent: Mar. 21, 2006

(54) LITHOGRAPHIC APPARATUS AND DEVICE MANUFACTURING METHOD

(75) Inventor: Pieter Willem Herman de Jager, Rotterdam (NL)

(73) Assignee: ASML Netherlands B.V, Veldhoven (NL)

( * ) Notice: Subject to any disclaimer, the term of this patent is extended or adjusted under 35 U.S.C. 154(b) by 56 days.

(21) Appl. No.: 10/788,256

(22) Filed: Feb. 27, 2004

(65) Prior Publication Data
US 2005/0190354 A1 Sep. 1, 2005

(51) Int. Cl.
G03B 27/42 (2006.01)
G03B 27/32 (2006.01)

(52) U.S. Cl. .................. 355/53; 355/77; 359/291; 359/292

(58) Field of Classification Search .............. 355/53, 355/67, 71, 77; 359/224, 290, 291, 572, 359/292
See application file for complete search history.

(56) References Cited

U.S. PATENT DOCUMENTS

| 5,311,360 | A | | 5/1994 | Bloom et al. |
| 5,500,736 | A | | 3/1996 | Koitabashi et al. |
| 5,523,193 | A | | 6/1996 | Nelson |
| 5,530,482 | A | | 6/1996 | Gove et al. |
| 5,539,568 | A | | 7/1996 | Lin et al. |
| 5,579,147 | A | | 11/1996 | Mori et al. |
| 5,677,703 | A | | 10/1997 | Bhuva et al. |
| 5,808,797 | A | | 9/1998 | Bloom et al. |
| 5,841,579 | A | * | 11/1998 | Bloom et al. ................ 359/572 |
| 5,982,553 | A | | 11/1999 | Bloom et al. |
| 6,133,986 | A | | 10/2000 | Johnson |
| 6,177,980 | B1 | | 1/2001 | Johnson |
| 6,433,917 | B1 | | 8/2002 | Mei et al. |
| 6,687,041 | B1 | | 2/2004 | Sandstrom |
| 6,707,534 | B1 | * | 3/2004 | Bjorklund et al. ............ 355/53 |
| 6,747,783 | B1 | | 6/2004 | Sandstrom |
| 6,795,169 | B1 | | 9/2004 | Tanaka et al. |
| 6,806,897 | B1 | | 10/2004 | Kataoka et al. |
| 6,811,953 | B1 | | 11/2004 | Hatada et al. |
| 6,870,601 | B1 | | 3/2005 | Liebregts et al. |
| 2004/0001257 | A1 | | 1/2004 | Akira et al. |
| 2004/0027667 | A1 | * | 2/2004 | Deutsch et al. ............. 359/566 |
| 2004/0041104 | A1 | | 3/2004 | Liebregts et al. |
| 2004/0130561 | A1 | * | 7/2004 | Jain .......................... 345/694 |
| 2004/0239908 | A1 | | 12/2004 | Bleeker et al. |
| 2004/0246559 | A1 | * | 12/2004 | Tamada et al. ............. 359/291 |
| 2005/0068511 | A1 | | 3/2005 | Liebregts et al. |

FOREIGN PATENT DOCUMENTS

| CN | 1472036 | 2/2004 |
| EP | 137036 | 12/2003 |
| EP | 1 482 375 A2 | 12/2004 |

OTHER PUBLICATIONS

European Search Report for European Application No. 05251078.1 mailed on Jun. 27, 2005, pp. 1-4.
Dialog File, Derwent English language abstract for CN1472036, 1 page.

* cited by examiner

Primary Examiner—Alan Mathews
(74) Attorney, Agent, or Firm—Sterne, Kessler, Goldstein & Fox P.L.L.C.

(57) ABSTRACT

A diffractive optical MEMS device includes a plurality of parallel planar reflective surfaces and an actuator system. The actuator system is used to adjust the position of each of the planar reflectors in a direction perpendicular to the planar reflectors to change characteristics (e.g., phase, intensity, etc.) of light interacting with the device.

3 Claims, 3 Drawing Sheets

LITHOGRAPHIC APPARATUS AND DEVICE MANUFACTURING METHOD

BACKGROUND OF THE INVENTION

1. Field of the Invention

The present invention relates to a lithographic apparatus and a device manufacturing method.

2. Related Art

A lithographic apparatus is a machine that applies a desired pattern onto a target portion of a substrate. The lithographic apparatus can be used, for example, in the manufacture of integrated circuits (ICs), flat panel displays, and other devices involving fine structures. In a conventional lithographic apparatus, a patterning means, which is alternatively referred to as a mask or a reticle, may be used to generate a circuit pattern corresponding to an individual layer of the IC (or other device), and this pattern can be imaged onto a target portion (e.g., including part of, one or several dies) on a substrate (e.g., a silicon wafer or glass plate) that has a layer of radiation-sensitive material (e.g., resist). Instead of a mask, the patterning means may comprise an array of individually controllable elements which serve to generate the circuit pattern.

In general, a single substrate will contain a network of adjacent target portions that are successively exposed. Known lithographic apparatus include steppers and scanners. In steppers, each target portion is irradiated by exposing an entire pattern onto the target portion during one pass. In scanners, each target portion is irradiated by scanning the pattern through the projection beam in a given direction (the "scanning"-direction), while synchronously scanning the substrate parallel or anti-parallel to this direction.

A lithographic apparatus is known that uses patterning devices including an array of individually controllable elements (e.g., a grating light valve). In particular, a lithographic apparatus is known in which each of the individually controllable elements is a diffractive optical MEMS device. Each diffractive optical MEMS device can include of a plurality of reflective ribbons. Alternate ribbons can be deformed, relative to the remaining ribbons, such that the undeformed ribbons form a grating (e.g., a diffraction gratin). Accordingly, in the undeformed state the diffractive optical MEMS device functions as a plane reflector, reflecting incident light. In the deformed state, the diffractive optical MEMS device functions as a grating, and the incident light is diffracted.

Using an appropriate spatial filter, the undiffracted light (i.e., the reflected light from diffractive optical MEMS devices functioning as planar reflectors) can be filtered out of the beam of radiation returned from the array, leaving only the diffracted light to reach the substrate. In this manner, the beam is patterned according to the addressing pattern of the array of diffractive optical MEMS devices. Typically, the array is matrix-addressable, using suitable electronic means.

The use of diffractive optical MEMS devices is, however, limited because each device is only capable of controlling the intensity of radiation directed onto a portion of the substrate, and cannot adjust the phase of the radiation relative to the radiation from adjacent devices.

SUMMARY OF THE INVENTION

Embodiments of the present invention provide an array of individually controllable elements that can pattern a beam of radiation with both contrast and phase information.

An embodiment of the present invention provides a patterning array for patterning a beam of radiation including a plurality of individually controllable elements. The individually controllable element each include a row of substantially parallel planar reflectors and an actuator system for setting the position of the reflectors in an actuation direction substantially perpendicular to the reflectors. The actuator system can set a first group of one or more reflectors to a desired one of a first plurality of distances, in the actuation direction, from a base of the patterning array and the actuator system can set a second group of one or more reflectors, independently of the first group, to a desired one of a second plurality of distances, in the actuation direction, from the base.

Accordingly, by actuating the two groups of reflectors independently, it is possible to control not only the separation between the reflectors in a distance perpendicular to the reflectors, thus controlling whether radiation is reflected or diffracted (and hence the contrast of a patterned beam of radiation from which either reflected or diffracted radiation has been filtered), but also the position of all of the reflectors relative to the base of the patterning array. This enables control of the phase of the radiation reflected/diffracted from each individually controllable element relative to adjacent individually controllable elements. Therefore, such a patterning array can be used to pattern a beam of radiation with both contrast and phase information.

Preferably, alternate reflectors in the row are in the first group of reflectors, the remaining reflectors being in the second group. Therefore, by setting the first group of reflectors to be at a different distance from the base of the patterning array than the second group, a grating is formed that diffracts incident radiation. In a preferred arrangement, each individually controllable element includes a row of six planar reflectors, three in the first group and three in the second group. In a further preferred arrangement, the separation between adjacent reflectors in the row is substantially one quarter of the wavelength of the radiation in the beam to be patterned. Many other combinations are contemplated by the inventor.

The actuator system can be arranged so as to at least one of the first and second pluralities of distances to at least three different distances. Accordingly, the distance between the groups of reflectors and/or the distance of the reflectors from the base (in other words, at least one of the contrast control and the phase control) can be set to one of at least three settings. Therefore, in addition to providing contrast and phase control, the individually controllable element can provide intermediate levels of at least one of the phase and contrast control. Preferably, the individually controllable elements can provide multiple intermediate levels of both phase and contrast. This capability can be used to provide greater control of the pattern generated on the substrate.

The control of at least one of the first and second pluralities of distances may include provision for a continuous range of values. This, in turn, can provide continuous control of the phase and/or contrast generated by the individually controllable element. This can provide further enhancement to the control of the pattern generated on the substrate by the exposure.

The actuator system can be configured so as to adjust the position of each of the reflectors independently within at least one of the first and second groups. This may be desirable in order to increase the contrast available, provide further imaging effects and/or enhanced calibration control of the phase and contrast control for each individually controllable element. It will be appreciated, however, that independent control of each reflector may increase the complexity of the actuator system and/or the control system that controls it.

Another embodiment of the present invention provides a lithographic apparatus including an illumination system for supplying a projection beam of radiation, a patterning array as described above for patterning the projection beam, a substrate table for supporting a substrate, and a projection system for projecting the patterned beam onto a target portion of the substrate.

Preferably, the lithographic apparatus also includes an array of focusing elements, each of which focuses a portion of the beam of radiation from the illumination system onto the planar reflectors of one of the individually controllable elements in the patterning array. Therefore, the radiation is only directed onto the active parts of the individually controllable elements, namely those parts that can be adjusted to control the phase and contrast of the radiation. Accordingly, the control of the phase and contrast of the resultant patterned beam is improved.

Each of the focusing elements within the array of focusing elements may also collect the radiation that is reflected and/or diffracted from its associated individually controllable element and direct it into the projection system. Therefore, in the resulting patterned beam that is projected onto the substrate, radiation from adjacent individually controllable elements is projected adjacent to each other on the substrate. This would not be the case if the loosely-packed array of individually controllable elements was directly imaged onto the substrate. In the latter case, the radiation from adjacent individually controllable elements would be projected onto the substrate at non-abutting locations. Accordingly, the use of the array of focusing elements enables the phase control of adjacent individually controllable elements to be put to effective use. For example, it can be used to provide improved contrast in the aerial image, increasing the resolution that can be printed.

A still further embodiment of the present invention provides a device manufacturing method including the steps of providing a substrate, providing a projection beam of radiation using an illumination system, using a patterning array to impart the projection beam with a pattern in its cross-section, and projecting the patterned beam of radiation onto a target portion of the substrate. The patterning array includes a plurality of individually controllable elements that each include a row of substantially parallel planar reflectors and an actuator system for setting the position to the reflectors in an actuation direction substantially perpendicular to the reflectors. For each individually controllable element, the actuator system is used to set a first group of one or more reflectors to a desired one of a first plurality of distances, in the actuation direction, from a base of the patterning array; and to set a second group of one or more reflectors, independently of the first group, to a desired one of a second plurality of distances, in the actuation direction, from the base.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

The present invention will now be described with reference to the accompanying drawings. In the drawings, like reference numbers may indicate identical or functionally similar elements.

DETAILED DESCRIPTION OF THE INVENTION

Figure 1:
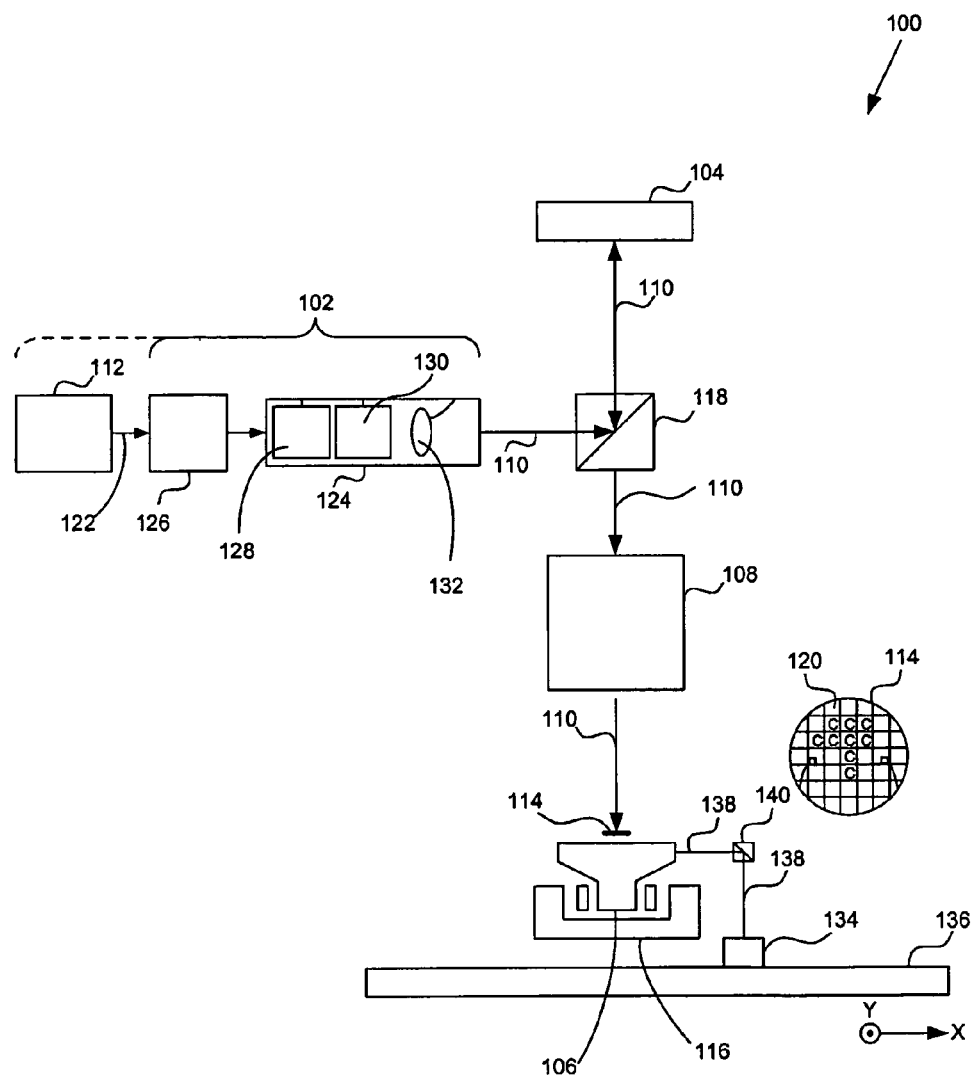
FIG. 1 depicts a lithographic apparatus according to an embodiment of the invention.

The term "array of individually controllable elements" as here employed should be broadly interpreted as referring to any means that can be used to endow an incoming radiation beam with a patterned cross-section, so that a desired pattern can be created in a target portion of the substrate. The terms "light valve," "grating light valve," and "Spatial Light Modulator" (SLM) can also be used in this context. Examples of such patterning means may include the following.

It should be appreciated that where pre-biasing of features, optical proximity correction features, phase variation techniques and multiple exposure techniques are used, for example, the pattern "displayed" on the array of individually controllable elements may differ substantially from the pattern eventually transferred to a layer of or on the substrate. Similarly, the pattern eventually generated on the substrate may not correspond to the pattern formed at any one instant on the array of individually controllable elements. This may be the case in an arrangement in which the eventual pattern formed on each part of the substrate is built up over a given period of time or a given number of exposures during which the pattern on the array of individually controllable elements and/or the relative position of the substrate changes.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat panel displays, thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g., having a wavelength of 365, 248, 193, 157 or 126 nm) and extreme ultra-violet (EUV) radiation (e.g., having a wavelength in the range of 5–20 nm), as well as particle beams, such as ion beams or electron beams.

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system."

The illumination system may also encompass various types of optical components, including refractive, reflective, and catadioptric optical components for directing, shaping, or controlling the projection beam of radiation, and such components may also be referred to below, collectively or singularly, as a "lens."

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

Lithographic Projection Apparatus

FIG. 1 schematically depicts a lithographic projection apparatus 100 according to an embodiment of the invention. Apparatus 100 includes at least a radiation system 102 (e.g., EX, IL (e.g., AM, IN, CO, etc.) etc.), an array of individually controllable elements PPM 104, an object table WT 106 (e.g., a substrate table), and a projection system ("lens") PL 108.

Radiation system 102 can be used for supplying a projection beam PB 110 of radiation (e.g., UV radiation), which in this particular case also comprises a radiation source LA 112.

Array of individually controllable elements 104 (e.g., a programmable mirror array) can be used for applying a pattern to the projection beam 110. In general, the position of the array of individually controllable elements 104 can be fixed relative to projection system 108. However, in an alternative arrangement, array of individually controllable elements 104 may be connected to a positioning device (not shown) for accurately positioning it with respect to projection system 108. As here depicted, individually controllable elements 104 are of a reflective type (e.g., has a reflective array of individually controllable elements).

Object table 106 can be provided with a substrate holder (not specifically shown) for holding a substrate W 114 (e.g., a resist-coated silicon wafer or glass substrate) and object table 106 can be connected to positioning device PW 116 for accurately positioning substrate 114 with respect to projection system 108.

Projection system (e.g., a lens) 108 (e.g., a quartz and/or $CaF_2$ lens system or a catadioptric system comprising lens elements made from such materials, or a mirror system) can be used for projecting the patterned beam received from beam splitter 118 onto a target portion C 120 (e.g., one or more dies) of the substrate 114. The projection system 108 may project an image of the array of individually controllable elements 104 onto the substrate 114. Alternatively, the projection system 108 may project images of secondary sources for which the elements of the array of individually controllable elements 104 act as shutters. The projection system 108 may also comprise a micro lens array (MLA) to form the secondary sources and to project microspots onto the substrate 114.

The source 112 (e.g., an excimer laser) can produce a beam of radiation 122. This beam 122 is fed into an illumination system (illuminator) IL 124, either directly or after having traversed conditioning device 126, such as a beam expander Ex, for example. The illuminator 124 may comprise adjusting device AM 128 for setting the outer and/or inner radial extent (commonly referred to as σ-outer and σ-inner, respectively) of the intensity distribution in the beam 122. In addition, it will generally comprise various other components, such as an integrator IN 130 and a condenser CO 132. In this way, the beam 110 impinging on the array of individually controllable elements 104 has a desired uniformity and intensity distribution in its cross-section.

It should be noted, with regard to FIG. 1, that the source 112 may be within the housing of the lithographic projection apparatus 100 (as is often the case when the source 112 is a mercury lamp, for example). In alternative embodiments, source 112 may also be remote from the lithographic projection apparatus 100. In this case, radiation beam 122 would be led into the apparatus 100 (e.g., with the aid of suitable directing mirrors). This latter scenario is often the case when the source 112 is an excimer laser. It is to be appreciated that both of these scenarios are contemplated within the scope of the present invention.

The beam 110 subsequently intercepts the array of individually controllable elements 104 after being directing using beam splitter 118. Having been reflected by the array of individually controllable elements 104, the beam 110 passes through the projection system 108, which focuses the beam 110 onto a target portion 120 of the substrate 114.

With the aid of the positioning device 116 (and optionally interferometric measuring device IF 134 on base plate BP 136 that receives interferometric beams 138 via beam splitter 140), the substrate table 106 can be moved accurately, so as to position different target portions 120 in the path of the beam 110. Where used, the positioning device for the array of individually controllable elements 104 can be used to accurately correct the position of the array of individually controllable elements 104 with respect to the path of the beam 110, e.g., during a scan. In general, movement of the object table 106 is realized with the aid of a long-stroke module (course positioning) and a short-stroke module (fine positioning), which are not explicitly depicted in FIG. 1. A similar system may also be used to position the array of individually controllable elements 104. It will be appreciated that the projection beam 110 may alternatively/additionally be moveable while the object table 106 and/or the array of individually controllable elements 104 may have a fixed position to provide the required relative movement.

In an alternative configuration of the embodiment, the substrate table 106 may be fixed, with the substrate 114 being moveable over the substrate table 106. Where this is done, the substrate table 106 is provided with a multitude of openings on a flat uppermost surface, gas being fed through the openings to provide a gas cushion which is capable of supporting the substrate 114. This is conventionally referred to as an air bearing arrangement. The substrate 114 is moved over the substrate table 106 using one or more actuators (not shown), which are capable of accurately positioning the substrate 114 with respect to the path of the beam 110. Alternatively, the substrate 114 may be moved over the substrate table 106 by selectively starting and stopping the passage of gas through the openings.

Although the lithography apparatus 100 according to the invention is herein described as being for exposing a resist on a substrate, it will be appreciated that the invention is not limited to this use and the apparatus 100 may be used to project a patterned projection beam 110 for use in resistless lithography.

The depicted apparatus 100 can be used in four preferred modes:

1. Step mode: the entire pattern on the array of individually controllable elements 104 is projected in one exposure (i.e., a single "flash") onto a target portion 120. The substrate table 106 is then moved in the x and/or y directions to a different position for a different target portion 120 to be exposed by the beam 110.

2. Scan mode: essentially the same as step mode, except that a given target portion 120 is not exposed in a single flash. Instead, the array of individually controllable elements 104 is movable in a given direction (the so-called "scan direction", e.g., the y direction) with a speed v, so that the projection beam 110 is caused to scan over the array of individually controllable elements 104. Concurrently, the substrate table 106 is simultaneously moved in the same or opposite direction at a speed V=Mv, in which M is the magnification of the projection system 108. In this manner, a relatively large target portion 120 can be exposed, without having to compromise on resolution.

3. Pulse mode: the array of individually controllable elements 104 is kept essentially stationary and the entire pattern is projected onto a target portion 120 of the substrate 114 using a pulsed radiation system 102. The substrate table 106 is moved with an essentially constant speed such that the projection beam 110 is caused to scan a line across the substrate 106. The pattern on the array of individually controllable elements 104 is updated as required between pulses of the radiation system 102 and the pulses are timed such that successive target portions 120 are exposed at the required locations on the substrate 114. Consequently, the projection beam 110 can scan across the substrate 114 to expose the complete pattern for a strip of the substrate 114. The process is repeated until the complete substrate 114 has been exposed line by line.

4. Continuous scan mode: essentially the same as pulse mode except that a substantially constant radiation system 102 is used and the pattern on the array of individually controllable elements 104 is updated as the projection beam 110 scans across the substrate 114 and exposes it.

Combinations and/or variations on the above described modes of use or entirely different modes of use may also be employed.

Exemplary Individually Controllable Element

Figure 2:
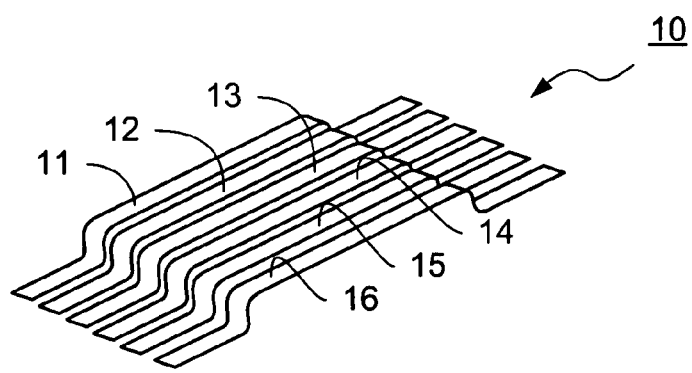
FIG. 2 depicts an individually controllable element in a first state according to an embodiment of the present invention.

FIG. 2 depicts an individually controllable element 10 according to an embodiment of the present invention. For example, in one embodiment a grating light valve can be used as individually controllable element 10. A general overview of grating light valves can be found in U.S. Pat. No. 5,661,592, which his incorporated herein by reference in its entirety. It has a plurality of reflective surfaces 11,12,13, 14,15,16 that are reflective to the radiation provided by the illumination system 102. The reflective surfaces 11–16 can be elongate ribbons and can be arranged adjacent to one another to form a row. It will be appreciated, however, that shapes other than elongate ribbons may also be used. The reflective surfaces can be arranged to be substantially parallel to each other. In a first position, all of the reflective surfaces 11–16 lie within a same plane. Therefore, the individually controllable element 10 functions as a planar reflector for radiation that is incident on it.

Figure 3:
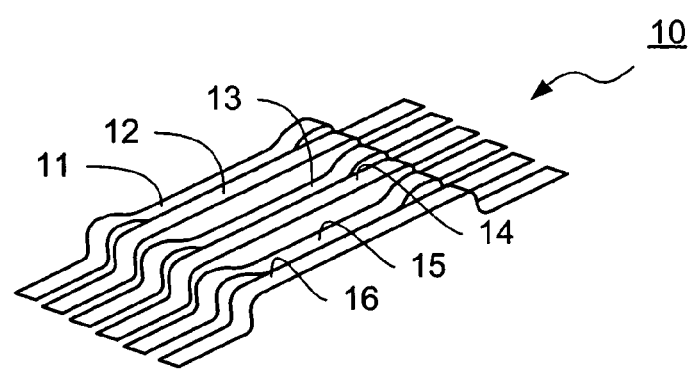
FIG. 3 depicts an individually controllable element in a second state according to an embodiment of the present invention.

Each of the individually controllable elements 10 has an associated actuator system (not shown) for adjusting the position of the ribbons. FIG. 3 shows the individually controllable element 10 in a second state according to an embodiment of the present invention. In this embodiment, alternate reflectors 11,13,15 are displaced relative to the remaining reflectors 12,14,16. Accordingly, the first group of reflective surfaces 11,13,15 lie within a first plane and a second group of reflective surfaces 12,14,16 lie in a second plane that is parallel to the first plane, but displaced from it in a direction perpendicular to the reflective surfaces. Accordingly, in the second state, the individually controllable element 10 functions as a grating (e.g., a diffraction grating) and radiation that is incident upon it is returned as diffracted radiation.

For example, if the separation between the first and second planes (in which the first and second groups of reflectors lie) in a direction perpendicular to the reflective surfaces is set to one quarter of the wavelength of the radiation generated by the illumination system 102, then all the of the radiation incident on the individually controllable element can be diffracted. It is to be appreciated that other configurations are also contemplated within the scope of the present invention.

The lithographic projection apparatus is provided with a filter (not shown), for example an aperture within the projection system, that can prevent either the reflected radiation (i.e., zero order radiation) or the diffracted radiation (i.e., first order, or higher, radiation) from being projected onto the substrate 114 by the projection system 108. Accordingly, by setting a selected set of the individually controllable elements 10 within a patterning array to be reflecting and others to be diffracting, a pattern is imparted to the beam of radiation 110 projected onto the substrate 114. For example, various patterning arrays are taught in U.S. application Ser. No. 10/449,908, filed May 30, 2003, entitled "Maskless Lithography Systems and Methods Utilizing Spatial Light Modulator Arrays," which is incorporated by reference in its entirety.

As shown in FIGS. 2 and 3, the displacement of one of the reflective surfaces may be achieved by deforming the shape of one of the ribbons. In one embodiment, when the actuation force applied to the ribbon is removed, the ribbon may naturally return to its undeformed state and consequently it will not require a return actuation force. It will be appreciated that, in such an arrangement, at least a part of each ribbon does not move when the reflective surface is displaced. Accordingly, only a portion of the individually controllable element 10 will be active (i.e., can be controlled). Furthermore, space may be required around each of the sets of ribbons in order to provide control circuitry (not shown) and/or other surfaces for each of the individually controllable elements 10. Therefore, the array of individually controllable elements 10 may only include a relatively small active area. This is commonly referred to as a "loose-packed" configuration.

Figure 4:
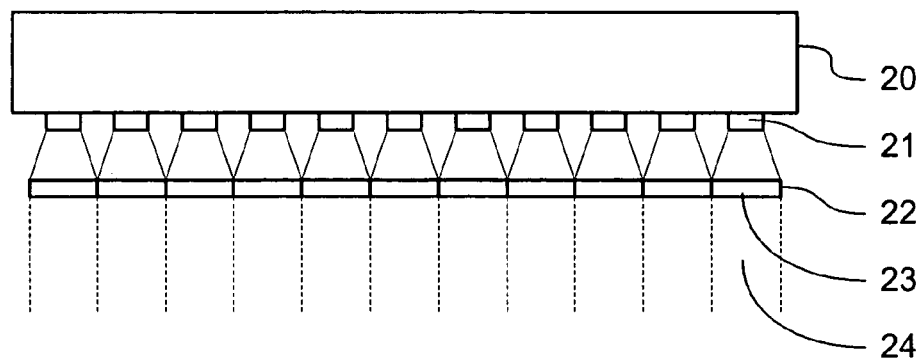
FIG. 4 depicts an array of individually controllable elements according to an embodiment of the present invention.

The lithographic apparatus may therefore be arranged as shown in FIG. 4. According to the embodiment of the present invention shown in FIG. 4, the array of individually controllable elements 20, which correspond to controllable elements 10 of FIGS. 2 and 3 (hereinafter both referred to as element 10), include active areas 21 (e.g., the moveable parts of the reflectors 11–16). An array 22 of focusing elements, such as an array of lenses 23, is provided adjacent to the array of individually controllable elements 10. Each focusing element 23 focuses a portion 24 of the beam of radiation from the illumination system 102 onto the active area 21 of a corresponding individually controllable element 10. Preferably, each focusing element 23 also collects the radiation that is either reflected or diffracted from the active area 21 of each individually controllable element 10 and directs the collected radiation to the projection system 108. Accordingly, the patterned beam of radiation is largely formed only from radiation that has been incident on the active areas 21 of the array of individually controllable elements 10 rather than the non-active areas that lie between the active areas 21.

The reflectors 11–16 can be actuated by any device known to one or ordinary skill in the art. The actuation can be provided by electrostatic forces between the reflector and a static portion of the array of individually controllable elements 10. However, the present invention is not limited to this. Alternatively, for example, each reflective surface (e.g., 11–16) may be mounted on a piezo-electric actuator (not shown).

FIGS. 5a, 5b, 5c and 5d show, in cross-section, an individually controllable element 10 in four different states according to an embodiment of the present invention.

Figure 5A:
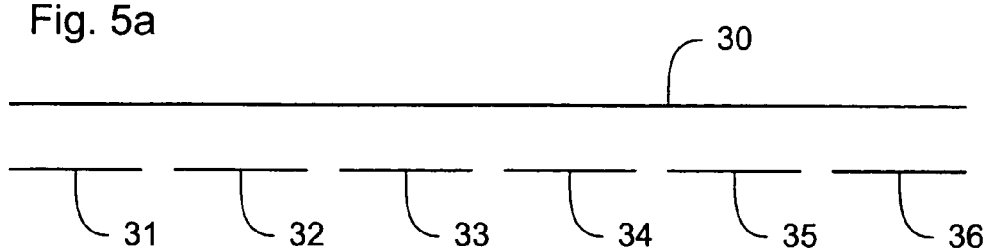
FIGS. 5a, 5b, 5c and 5d depict, in cross-section, an individually controllable element according to an embodiment of the present invention in four different states.

FIG. 5a shows the individually controllable element 10 in a first state, in which all of the reflective surfaces 31,32,33, 34,35,36 are within a common plane (e.g., reflective surfaces 31–36 are substantially parallel planar reflectors) and are a given distance, in a direction perpendicular to that plane, from a base 30 of the array of individually controllable element 10. Accordingly, the individually controllable element 10 functions as a planar reflector to incident radiation.

Figure 5B:
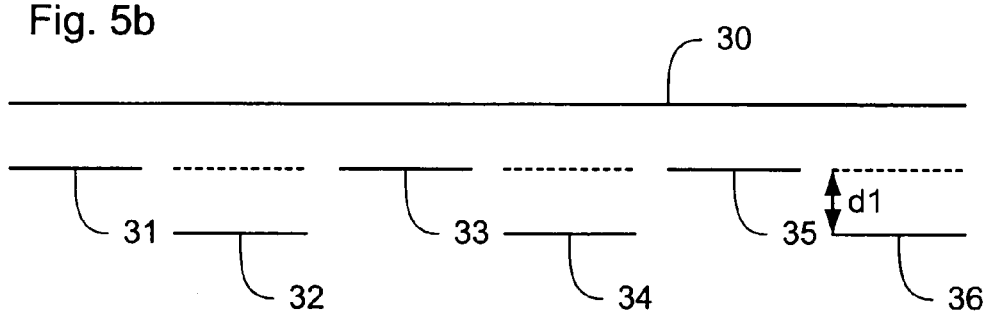

In a second state, shown in FIG. 5b, alternative reflective surfaces 32,34,36 are displaced relative to the remaining reflective surfaces 31,33,35. Consequently, the individually controllable element 10 functions as a grating (e.g., a diffraction grating) and incident radiation is diffracted.

Figure 5C:
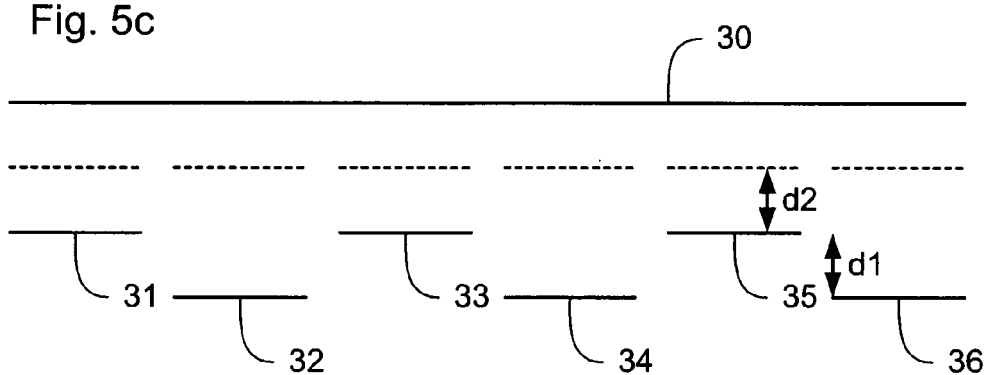

FIG. 5c shows the individually controllable element 10 in a third state. As with the element in the second state shown in FIG. 5b, alternate reflective surfaces 32,34,36 are displaced relative to the remaining reflective surfaces 31,33,35 in a direction perpendicular to the reflective surfaces. Therefore, as before, the element 10 functions as a grating and the incident radiation is diffracted. However, in comparison to the element 10 in the second state, all of the reflective surfaces (31–36) are further displaced in a direction perpendicular to the reflective surfaces. Accordingly, if a first individually controllable element 10 is set to the second state and an adjacent individually controllable element 10 is set to the third state, radiation incident on both individually controllable elements 10 will be diffracted, but there will be a phase difference in the diffracted radiation of one individually controllable element relative to the other.

Figure 5D:
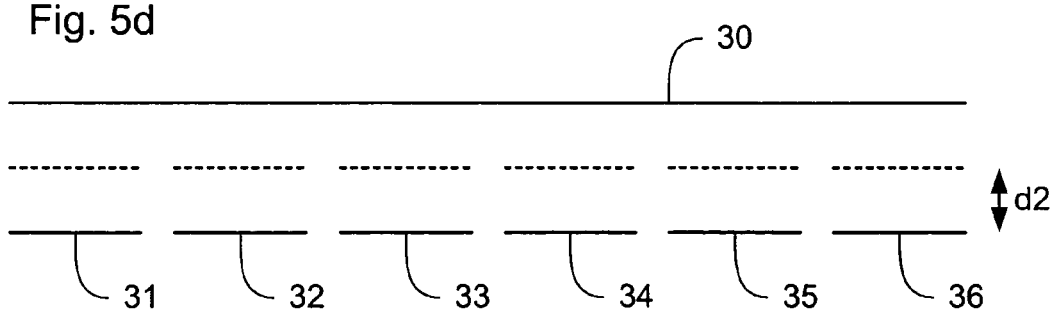

FIG. 5d shows an individually controllable element in a fourth state. In this case, all of the reflective surfaces 31,32,33,34,35,36 are within a single plane such that, as in the first state, shown in FIG. 5a, the individually controllable element 10 functions as a planar reflector reflecting incident radiation. However, all of the reflective surfaces (31–36) are displaced relative to their position when in the first state, shown in FIG. 5a. Therefore, if a first individually controllable element 10 is set to the first state and a second individually controllable element 10 is set to the fourth state, then both individually controllable elements 10 will act as planar reflectors, reflecting radiation, but there is a phase shift in the radiation reflected from the first individually controllable element 10 relative to the radiation reflected from the second individually controllable element 10.

Therefore, by separately controlling the positions of the two groups of reflective surfaces, namely a first group with alternate reflective surfaces 32,34,36 and a second group with the remaining reflective surfaces 31,33,35, it is possible to provide an individually controllable element 10 with both contrast and phase control. In turn, by setting selected sets of individually controllable elements 10 to one of the four states, the beam projected onto the substrate 114 is patterned with both contrast and phase information.

As shown in FIGS. 5a, 5b, 5c and 5d, a distance d1 represents the distance between the planes of the two groups of reflective surfaces and a distance d2 represents the distance of the grating/reflector formed by the reflective surfaces relative to a reference position. Therefore, setting the distance d2 for an individually controllable element 10 effectively sets distance of the grating/reflector relative to the substrate 114. Therefore, by setting d2 for adjacent individually controllable elements to different values, a phase difference in the radiation reflected/diffracted from each to the substrate 114 can be provided.

For example, if the difference in d2 values for adjacent individually controllable elements is set to a quarter of the wavelength of the radiation provided by the illumination system 102, the radiation at the substrate 114 from one will be fully out of phase with the radiation from the other. If, however, the d2 values are set to be the same, the radiation from each will be in phase with each other. It will be appreciated that by setting d2 to intermediate values between a minimum and maximum value, intermediate phase shifts can be obtained.

As discussed above, setting d1 to zero causes the individually controllable element 10 to function as a planar reflector. Setting d1 to be, for example, a quarter of the wavelength of the radiation provided by the illumination system 102, results in the individually controllable element 10 functioning as a pure grating, namely no zero order radiation being reflected. Accordingly, if, for example, the pupil of the projection system 108 is set to filter out all diffracted radiation (e.g., first order and higher radiation) then the intensity of the radiation directed into the projection system 108 from a given individually controllable element 10 will be a maximum when d1 is zero (or set to a minimum). Conversely, if the projection system aperture is arranged such that the zero order radiation is not directed into the projection system 108, but first order radiation is, then the radiation in the projection system 108 from the individually controllable element 10 will be a minimum when d1 is set to zero and a maximum when d1 is set to the quarter wavelength value.

It will be appreciated that when d1 is set to intermediate values, some of the radiation incident on the individually controllable elements 10 will be reflected and some will be diffracted. Therefore, the intensity of the radiation from the individually controllable element 10 that passes through the projection system 108 and is projected onto the substrate 114 will likewise be at an intermediate value. Therefore, adjusting d1 can be used to set the contrast of the individually controllable element 10. It will further be appreciated that contrast control can also be achieved by varying d1 through values other than from zero to a quarter wavelength of the radiation provided by the illumination system 102. For example, a similar effect will be provided by controlling d1 to vary between three quarters of the wavelength and one wavelength.

The actuator system may be arranged such that it can set the reflective surfaces to a limited number of predetermined positions. For example, the actuator system can nominally set each of d1 and d2 to one of two values. In this case the individually controllable element 10 may only be set to the four states shown in FIGS. 5a, 5b, 5c and 5d. These can correspond to the individually controllable element 10 being set to provide a maximum and a minimum level of radiation in the projection system 108 (namely on or off) and for providing radiation that is either in phase or out of phase with that of the adjacent individually controllable element 10. Alternatively, the actuator system may be arranged such that it can provide a plurality of intermediate values of d1 and/or d2 providing a plurality of contrast levels and/or phase differences between adjacent individually controllable elements 10. The actuator system can, furthermore, be arranged such that d1 and d2 can be set to a continuous range of values between a minimum and a maximum.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A lithographic apparatus, comprising:
   an illumination system that supplies a beam of radiation;
   a patterning array that patterns the beam of radiation, the patterning array including a plurality of individually controllable elements that each include,
   a row of substantially parallel planar reflectors, and
   an actuator system that moves a position of the reflectors in an actuation direction that is substantially perpendicular to the reflectors,
   wherein the actuator system moves a first group of one or more reflectors in the actuation direction to a respective one of a first plurality of distances from a base of the patterning array,
   wherein the actuator system moves a second group of one or more reflectors in the actuation direction, independently of the first group, to a respective one of a second plurality of distances from the base;
   a plurality of focusing elements corresponding to the plurality of individually controllable elements each one of the focusing elements focusing a portion of the beam onto a respective one of the planar reflectors of an associated one of the individually controllable elements in the patterning array;
   a substrate table that supports a substrate; and
   a projection system that projects the patterned beam onto a target portion of the substrate.

2. The lithographic apparatus according to claim 1, wherein each focusing element collects the radiation that has one of reflected or diffracted from the associated individually controllable element and directs it into the projection system.

3. A device manufacturing method, comprising:
   focusing portions of a beam of light using individual focusing elements in an array of focusing elements onto respective reflectors in an array of individually controllable elements having a row of substantially parallel planar ones of the reflectors;
   patterning the beam of light using the array of individually controllable elements and an actuator system that sets the position of the reflectors in an actuation direction substantially perpendicular to the reflectors through
      using the actuator system to move a first group of one or more reflectors in the actuation direction to a desired one of a first plurality of distances from a base of the patterning array; and
      using the actuator system to move a second group of one or more reflectors in the actuation direction, independently of the first group, to a desired one of a second plurality of distances from the base; and
   projecting the patterned beam of radiation onto a target portion of a substrate.

* * * * *